(12) United States Patent
Noda et al.

(10) Patent No.: US 8,148,726 B2
(45) Date of Patent: Apr. 3, 2012

(54) DISPLAY DEVICE AND MANUFACTURING METHOD THEREOF

(75) Inventors: Takeshi Noda, Mobara (JP); Toshio Miyazawa, Chiba (JP); Takuo Kaitoh, Mobara (JP); Daisuke Sonoda, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 12/844,887

(22) Filed: Jul. 28, 2010

(65) Prior Publication Data
US 2011/0024763 A1 Feb. 3, 2011

(30) Foreign Application Priority Data
Jul. 30, 2009 (JP) ................................. 2009-177954

(51) Int. Cl.
*H01L 33/013* (2006.01)
(52) U.S. Cl. ........ 257/59; 257/66; 257/72; 257/E33.003
(58) Field of Classification Search ................. 257/59, 257/66, 72, E33.003
See application file for complete search history.

(56) References Cited

U.S. PATENT DOCUMENTS
6,888,160 B1 * 5/2005 Nakajima et al. ............... 257/59
2007/0138475 A1 * 6/2007 Kitakado et al. ............... 257/66

FOREIGN PATENT DOCUMENTS
JP 10-96956 4/1998
* cited by examiner

*Primary Examiner* — Cuong Q Nguyen
*Assistant Examiner* — Tran Tran
(74) *Attorney, Agent, or Firm* — Antonelli, Terry, Stout & Kraus, LLP.

(57) ABSTRACT

A display device which has thin film transistors, wherein a semiconductor layer includes a first layer, second layers and third layers, the first layer has a channel region, the second layers are an impurity layer, the third layers are a low-concentration impurity layer, the second layers have connection portions connected with an electrodes, the third layers are formed to annularly surround the second layers, a channel-region-side edge portion out of edge portions of the third layer is in contact with the first layer, the edge portions of the third layer but the channel-region-side edge portion are in contact with an interlayer insulation film, the second layers have a first region where the second layer overlaps with a gate electrode and a second region where the second layer does not overlap with the gate electrode, and the connection portion is in the second region.

6 Claims, 9 Drawing Sheets

DISPLAY DEVICE AND MANUFACTURING METHOD THEREOF

CROSS-REFERENCE TO RELATED APPLICATION

The present application claims priority from Japanese application JP 2009-177954 filed on Jul. 30, 2009, the content of which is hereby incorporated by reference into this application.

BACKGROUND OF THE INVENTION

1. Field of the Invention

The present invention relates to a display device and a manufacturing method thereof, and more particularly to a display device in which thin film transistors are formed on a substrate and a manufacturing method thereof.

2. Description of the Related Art

An active-matrix-type display device is configured as follows. Respective pixels are arranged in a matrix array. By supplying a scanning signal to a signal line (gate signal line) shared in common by the respective pixels arranged in a row direction, a group of pixels arranged on the same row is selected. Then, the signal lines which supply the scanning signal are sequentially scanned in a columnar direction (from top to bottom in a display region, for example). In conformity with such selection and scanning timing, a video signal is supplied to the respective pixels arranged in the columnar direction through a signal line (drain signal line) shared in common by the respective pixels.

For this end, each pixel includes a thin film transistor which is a switching element for supplying a video signal from the drain signal line to the pixels (pixel electrodes) in response to the supply of the scanning signal.

Further, on the same substrate on which the pixels are formed, a drive circuit which supplies a scanning signal to the gate signal lines and supplies a video signal to the drain signal lines is mounted. The drive circuit is also constituted of a circuit which includes a plurality of thin film transistors.

Here, the thin film transistor is constituted of a so-called MIS (Metal Insulator Semiconductor) transistor in which a gate insulation film is formed so as to cover a gate electrode, a semiconductor layer is formed on an upper surface of the gate insulation film in a state where the semiconductor layer straddles the gate electrode, and a pair of electrodes (a drain electrode and a source electrode) which are arranged in an opposed manner with a region above the gate electrode (channel region) sandwiched therebetween is formed on an upper surface of the semiconductor layer.

Further, there has been known a thin film transistor where portions which connect a semiconductor layer and respective electrodes include a high-concentration impurity layer ($n^+$ layer) as a contact layer, and a low-concentration impurity layer ($n^-$ layer) having the same conductive type as the high-concentration impurity layer is formed on a channel region side of the high-concentration impurity layer. The low-concentration impurity layer is referred to as a so-called LDD (Lightly Doped Drain) layer and, for example, is provided for alleviating the concentration of an electric field between the contact layer and the gate electrode.

A display device having such a thin film transistor is disclosed in JP-A-10-96956 (patent document 1), for example.

SUMMARY OF THE INVENTION

However, the thin film transistor disclosed in patent document 1 requires a particular step for forming the LDD layers and, at the same time, there exists a possibility that even when the thin film transistor is in an OFF state, the concentration of impurities in the LDD layer which is the low-concentration impurity layer ($n^{31}$ layer) formed above the gate electrode is decreased due to an electric field of the gate electrode so that an OFF current of the thin film transistor is increased.

Further, when the display device is a liquid crystal display device having a backlight, light emitted from the backlight is radiated to the LDD layer of the thin film transistor so that there also exists a drawback that an optical leak current is generated.

The invention has been made under such circumstances, and it is an object of the invention to provide a display device which can reduce an OFF current and also reduce an optical leak current in a thin film transistor which includes an LDD layer, and a manufacturing method thereof.

(1) To overcome the above-mentioned drawbacks, according to one aspect of the invention, there is provided a display device which includes thin film transistors on a substrate, each thin film transistor including: a gate electrode; a gate insulation film which is formed so as to cover the gate electrode; a semiconductor layer which is formed on the gate insulation film in a state where the semiconductor layer straddles the gate electrode; a pair of electrodes which is connected with the semiconductor layer; and an interlayer insulation film which is formed over the semiconductor layer, wherein the semiconductor layer includes a first layer, a pair of second layers and a pair of third layers, a portion of the first layer is a channel region of the thin film transistor, the pair of second layers is formed of an impurity layer doped with predetermined impurity ions, the pair of third layers is formed of a low-concentration impurity layer with impurity concentration lower than impurity concentration in the second layers, the second layers respectively have connection portions which are connected with the pair of electrodes respectively, the third layers are respectively formed so as to annularly surround the pair of second layers respectively, a channel-region-side edge portion out of edge portions of the third layer is brought into contact with the first layer as viewed in a plan view, the edge portions of the third layer except for the channel-region-side edge portion are brought into contact with the interlayer insulation film, the second layers respectively have a first region where the second layer overlaps with the gate electrode as viewed in a plan view and a second region where the second layer does not overlap with the gate electrode as viewed in a plan view, and the connection portion is formed in the second region.

(2) In the display device having the constitution (1), the pair of respective electrodes is formed in a spaced-apart manner from the gate electrode with 1 μm or more as viewed in a plan view.

(3) In the display device having the constitution (1) or (2), contact holes are formed in the interlayer insulation film, the pair of electrodes is connected with the second layers via the contact holes, and the contact hole is filled with one of the pair of electrodes and an insulation film different from the interlayer insulation film.

(4) In the display device having any one of the constitutions (1) to (3), out of the pair of electrodes, at least one electrode includes an aluminum thin film.

(5) In the display device having any one of the constitutions (1) to (4), the semiconductor layer is made of polysilicon or microcrystalline silicon.

(6) To overcome the above-mentioned drawbacks, according to another aspect of the invention, there is provided a method of manufacturing a display device provided with thin film transistors, each thin film transistor including: a gate electrode; a gate insulation film which is formed so as to cover the gate electrode; a semiconductor layer which is formed on the gate insulation film in a state where the semiconductor layer straddles the gate electrode; and an interlayer insulation film which is formed over the semiconductor layer, the method including the steps of: forming a photoresist film having a predetermined film thickness on the interlayer insulation film; forming a pair of openings, a first region which is provided around the respective openings and has a first film thickness smaller than the predetermined film thickness, and a second region which is provided around the first region and has a second film thickness larger than the first film thickness on the photoresist film; forming a pair of contact holes for exposing a portion of the semiconductor layer in the interlayer insulation film using the photoresist film as a mask; exposing a portion of the interlayer insulation film which overlaps with the first region by decreasing the first film thickness and the second film thickness by ashing the photoresist film; forming the portions of the semiconductor layer which are exposed by the contact holes into high-concentration impurity layers by implantation of impurity ions; forming a portion of the semiconductor layer which overlaps with the first region into a low-concentration impurity layer by implantation of impurity ions; and forming a source electrode and a drain electrode which are connected with the high-concentration impurity layers via the respective contact holes, wherein a peak position at which the impurity ions are implanted is set deeper in the step of implanting the second impurity ions than in the step of implanting the first impurity ions, the high-concentration impurity region includes a third region which overlaps with the gate electrode as viewed in a plan view and a fourth region which does not overlap with the gate electrode as viewed in a plan view, and the source electrode and the drain electrode are connected with the high-concentration impurity layer in the fourth region.

(7) In the method of manufacturing a display device having the constitution (6), the method further includes the step of exposing positions corresponding to the openings with a first quantity of light, exposing a position corresponding to the first region with a second quantity of light smaller than the first quantity of light, and shielding a position corresponding to the second region from light.

(8) In the method of manufacturing a display device having the constitution (7), the exposure step uses an exposure mask by which the positions corresponding to the openings are subjected to total radiation, the position corresponding to the first region is subjected to the partial radiation, and the position corresponding to the second region is shielded from light.

(9) In the method of manufacturing a display device having any one of the constitutions (6) to (8), the source electrode and the drain electrode are respectively formed in a spaced-apart manner from the gate electrode with 1 μm or more as viewed in a plan view.

(10) In the method of manufacturing a display device having anyone of the constitutions (6) to (9), the method further includes the step of forming a protective film on the interlayer insulation film, wherein the respective contact holes are filled with one of the source electrode and the drain electrode and the protective film.

(11) In the method of manufacturing a display device having any one of the constitutions (6) to (10), the semiconductor layer is made of polysilicon or microcrystalline silicon.

According to the display device and the method of manufacturing the display device of the invention, it is possible to realize the reduction of an OFF current and the reduction of an optical leak current even in the display device is provided with thin film transistors each of which includes an LDD layer.

Other advantages of the invention will become apparent from the description of the whole specification.

DETAILED DESCRIPTION OF THE INVENTION

Hereinafter, the explanation is made with respect to embodiments to which the invention is applied in conjunction with drawings. In the explanation made hereinafter, the same constitutional elements are given same symbols and their repeated explanation is omitted.

EMBODIMENT 1

[Pixel Constitution]

Figure 1:
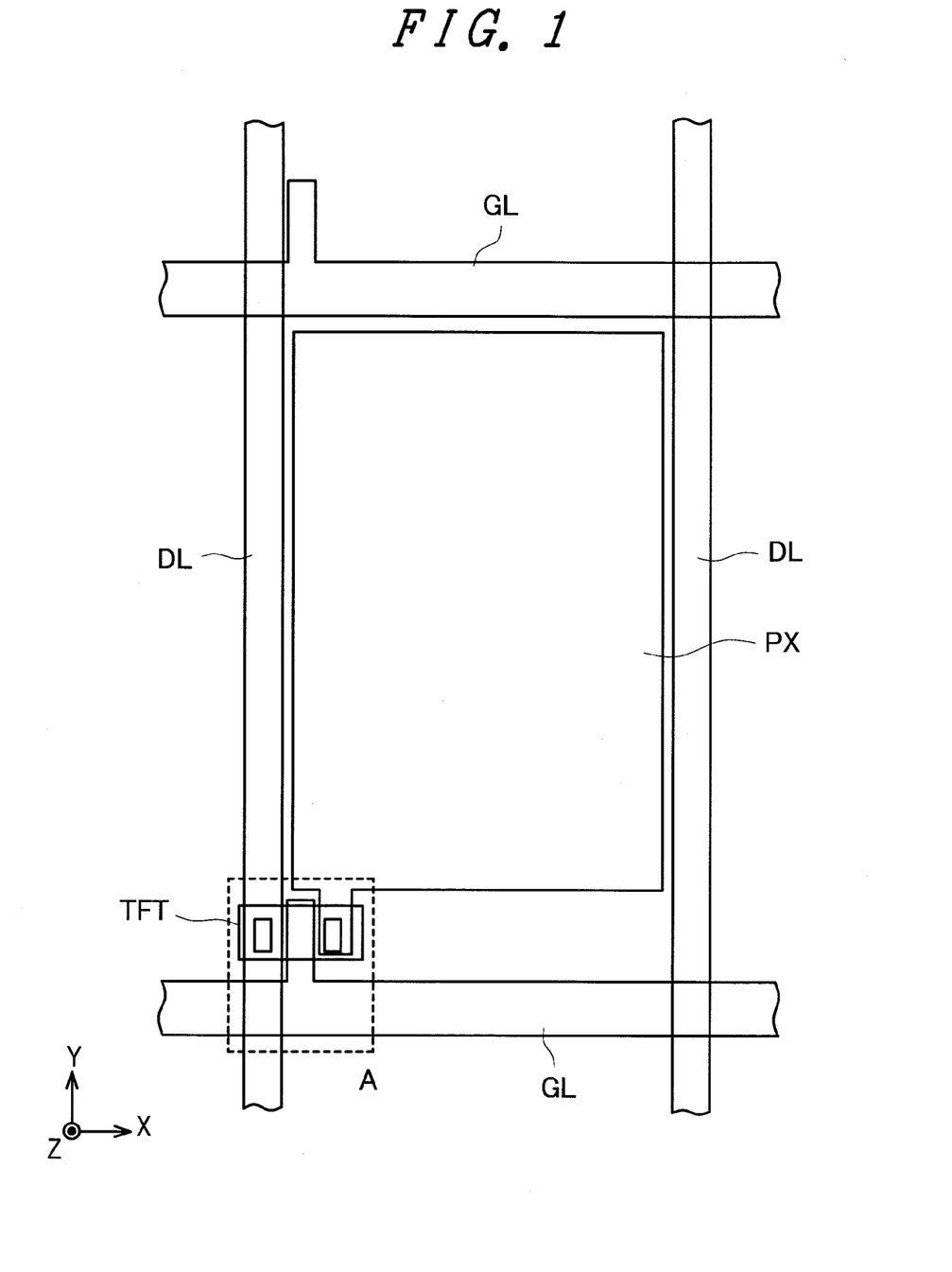
FIG. 1 is a plan view for explaining one example of the constitution of a pixel in a display device according to an embodiment of the invention.
Figure 2:
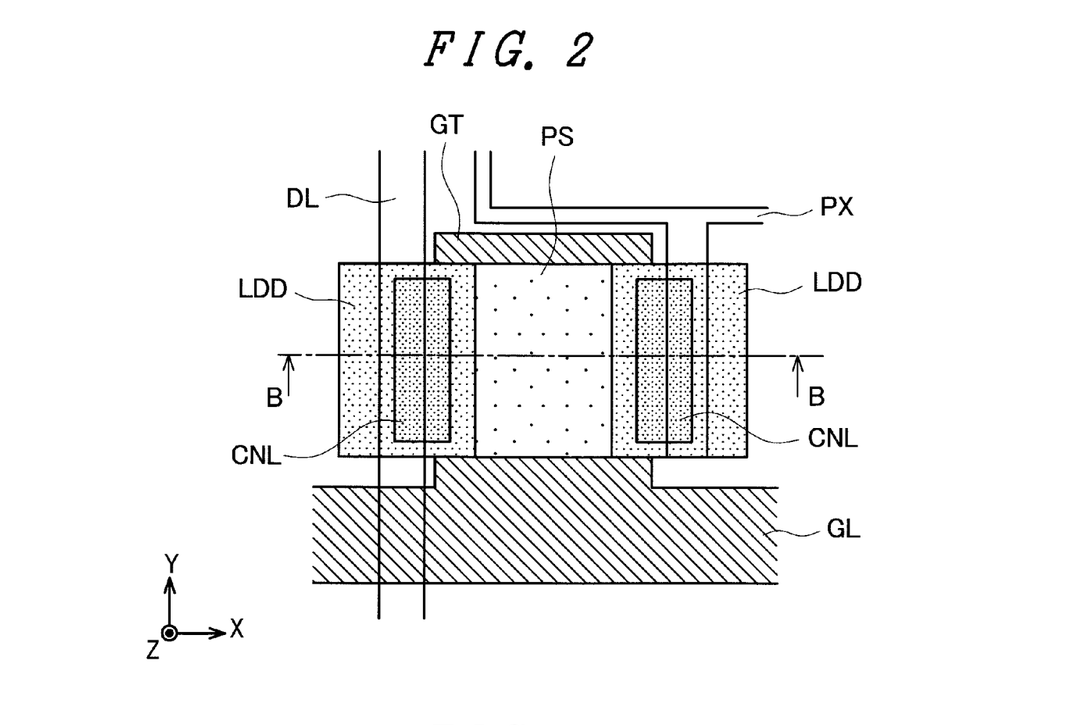
FIG. 2 is an enlarged view of a portion indicated by a dotted-line frame A in FIG. 1.
Figure 3:
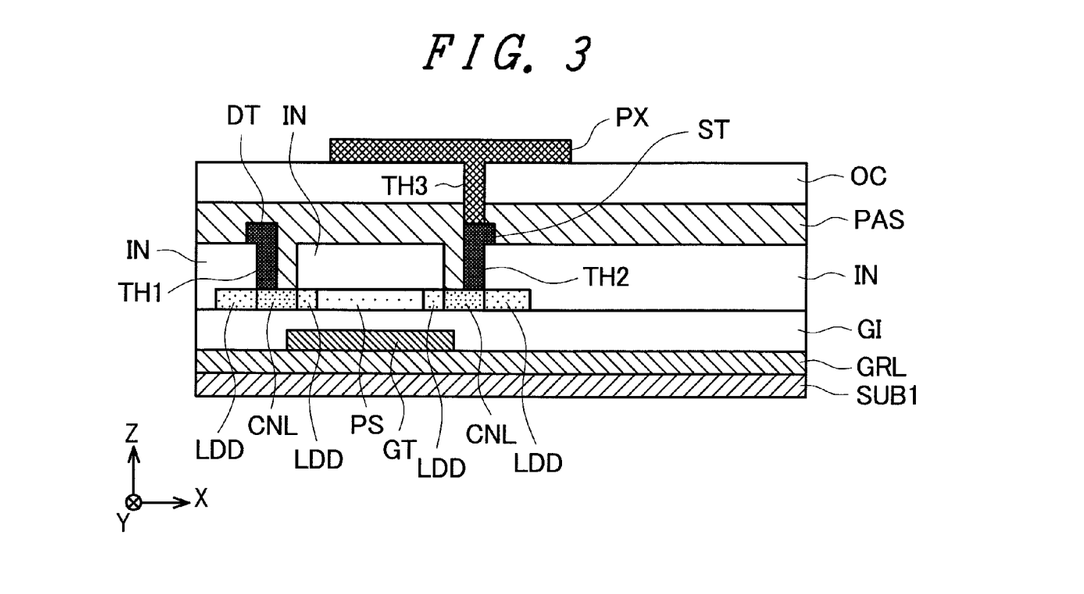
FIG. 3 is a cross-sectional view taken along a line B-B in FIG. 2.

FIG. 1 is a plan view for explaining one example of the constitution of a pixel in a display device according to an embodiment of the invention, and FIG. 2 is an enlarged view of a portion indicated by a dotted-line frame A in FIG. 1. Further, FIG. 3 is a cross-sectional view taken along a line B-B in FIG. 2. Here, FIG. 1 shows the constitution of a pixel which is formed on a liquid-crystal-side surface (main surface) of one substrate (first substrate SUB1) out of a pair of substrates which is arranged to face each other in an opposed manner with liquid crystal sandwiched therebetween. Further, symbols X, Y, Z in FIG. 1 to FIG. 3 indicate an X axis, a Y axis, and a Z axis respectively.

As shown in FIG. 1, in the display device according to this embodiment, gate signal lines GL which extend in the X axis direction and are arranged parallel to each other in the Y axis direction in the drawing and drain signal lines DL which extend in the Y axis direction and are arranged parallel to each other in the X axis direction in the drawing are formed on an upper surface of a background layer GRL (see FIG. 3) which is formed on a main surface of the first substrate SUB1 (see FIG. 3). A rectangular-shaped region which is surrounded by the gate signal lines GL and the drain signal lines DL constitutes a pixel region.

The gate signal line GL forms a gate electrode GT which projects toward the pixel region on a portion thereof, for example. The gate electrode GT constitutes a gate electrode of a thin film transistor TFT. With respect to a source electrode ST and a drain electrode DT of the thin film transistor TFT, one electrode is connected with the drain signal line DL, and the other electrode is connected with a pixel electrode PX which is formed in the pixel region. Hereinafter, the electrode which is connected with the drain signal line DL is referred to as the drain electrode DT, and the electrode which is connected with the pixel electrode PX is referred to as the source electrode ST.

As shown in FIG. 3, on an upper surface of the first substrate SUB1, an insulation film GI which covers the gate signal lines GL is formed. The insulation film GI functions as a gate insulation film within a region where the thin film transistor TFT is formed.

On a surface of the insulation film GI, a semiconductor layer PS which is formed of an island-shaped i layer is formed, wherein the semiconductor layer PS is formed by transforming amorphous silicon (amorphous semiconductor) into poly-silicon (polycrystalline semiconductor) by the radiation of a laser beam, for example. In the semiconductor layer PS, a region which constitutes a channel region of the thin film transistor TFT is formed of an intrinsic semiconductor layer or a semiconductor layer ($P^-$ layer) which contains a small quantity of impurities (for example, boron ion) necessary for a threshold value control. Besides polysilicon, the semiconductor layer PS may be made of microcrystalline silicon, or may be formed of a stacked body consisting of a polysilicon layer and an amorphous silicon layer, or a stacked body consisting of a microcrystalline silicon layer and an amorphous silicon layer. The semiconductor layer PS is arranged so as to intersect the gate electrode GT in a state where the semiconductor layer PS straddles the gate electrode GT.

Further, as shown in FIG. 2 and FIG. 3, the semiconductor layer PS which is arranged so as to straddle the gate electrode GT includes contact layers CNL which are respectively connected with the source electrode ST and the drain electrode DT. The contact layer CNL is a high-concentration impurity layer ($n^+$ layer) which is doped with n-type impurities at high concentration. The contact layers CNL are provided for lowering a connection resistance between the source electrode ST and the channel region and between the drain electrode DT and the channel region. Further, the semiconductor layer PS includes annular low-concentration impurity layers (LDD layers, $n^-$ layers) LDD which are doped with n-type impurities at low concentration in a state that the low-concentration impurity layers LDD respectively surround the contact layers CNL. The low-concentration impurity layers LDD are provided for alleviating the concentration of an electric field between the semiconductor layer PS and the gate electrode GT.

As shown in FIG. 2 and FIG. 3, the low-concentration impurity layer LDD is formed on both edge portions of the semiconductor layer PS. That is, a region formed of an intrinsic semiconductor layer or a $P^-$ layer substantially equal to the intrinsic semiconductor layer or the $P^-$ layer of the channel region is not formed outside the low-concentration impurity layers LDD.

When the region formed of the intrinsic semiconductor layer or the $P^-$ layer is formed in an extending manner outside of the low-concentration impurity layer LDD from the channel region (that is, when the region formed of the intrinsic semiconductor layer or the $P^-$ layer is formed so as to surround the low-concentration impurity layer LDD), an optical leak current is generated. This is because the region formed of the intrinsic semiconductor layer or the $P^-$ layer which is positioned outside the low-concentration impurity layer LDD does not overlap with the gate electrode as viewed in a plan view so that a backlight light is radiated to the region without being blocked by the gate electrode.

In this embodiment, a region formed of the intrinsic semiconductor layer or the $P^-$ layer which is substantially equal to the intrinsic semiconductor layer or the $P^-$ layer which constitutes the channel region is not formed outside the low-concentration impurity layers LDD and hence, it is possible to suppress the generation of the above-mentioned optical leak current.

An interlayer insulation film IN which covers the semiconductor layer PS is formed over an upper surface of the first substrate SUB1, and the drain signal line DL and the source electrode ST which are respectively formed of an aluminum thin film are formed on an upper surface of the interlayer insulation film IN.

A portion of the drain signal line DL is connected with the contact layer CNL as the drain electrode DT via a contact hole TH1 which is formed in the interlayer insulation film IN and exposes one contact layer CNL of the semiconductor layer PS. In this embodiment, a portion of a surface region of the contact layer CNL which is exposed via the contact hole TH1 is connected with an aluminum thin film which constitutes the drain electrode DT. Here, in the formation of the thin film transistor TFT, a connection position between the contact layer CNL and the drain electrode DT is spaced apart from the gate electrode GT in the direction that the drain electrode DT and the source electrode ST which are a pair of electrodes with the gate electrode GT sandwiched therebetween are formed, that is, in the X direction. That is, the contact layer CNL and the drain electrode DT are connected with each other at a position spaced apart from the channel region of the thin film transistor TFT. Due to such a constitution, in this embodiment, in the contact hole TH1, the drain electrode DT which is connected with the contact layer CNL and a protective film PAS described later are formed. As a result, on a region of the contact layer CNL where the contact hole TH1 is formed, the drain electrode DT and the protective film PAS are formed in a state where the drain electrode DT and the protective film PAS are in contact with the contact layer CNL.

Further, the source electrode ST is connected with the contact layer CNL via a contact hole TH2 which is formed in the interlayer insulation film IN and exposes the other contact layer CNL of the semiconductor layer PS. Also in this case, in the same manner as the drain electrode DT described above, the source electrode ST is formed such that the connection position between the contact layer CNL and the source electrode ST is spaced apart from the gate electrode GT. That is, the contact layer CNL and the source electrode ST are connected with each other at a position spaced apart from the channel region of the thin film transistor TFT.

In other words, the source electrode ST and the drain electrode DT do not overlap with the gate electrode GT as viewed in a plan view and, at the same time, are not brought into contact with the low-concentration impurity layers LDD which are positioned at a channel region side.

When the source electrode ST and the drain electrode DT overlap with the gate electrode GT as viewed in a plan view, even when the low-concentration impurity layers LDD are formed, a strong electric field is generated between the source electrode ST and the gate electrode GT and between the drain electrode DT and the gate electrode GT and hence, an electric-field-concentration alleviating effect of the low-concentration impurity layer LDD is lowered. Further, when the source electrode ST and the drain electrode DT are brought into contact with the low-concentration impurity layers LDD which are positioned at a channel region side, a potential which makes holes flow out from portions where the source electrode ST and the drain electrode DT are brought into contact with the low-concentration impurity layers LDD is increased. Accordingly, an OFF current of the thin film transistor is increased.

In the structure of this embodiment, the source electrode ST and the drain electrode DT do not overlap with the gate electrode GT as viewed in a plan view and hence, it is possible to prevent the application of a strong electric field between the source electrode ST and the gate electrode GT and between the drain electrode DT and the gate electrode GT. Further, the source electrode ST and the drain electrode DT are not brought into contact with the low-concentration impurity layers LDD which are positioned at a channel region side and are surely brought into contact with the high-concentration impurity layers ($n^+$ layers) respectively and hence, a potential which cause the flow of holes can be suppressed. This is because a large number of electrons are present in the high-concentration impurity layer ($n^+$ layer) and hence, a potential which causes the flow of holes is small. Due to the above-mentioned reasons, the structure of this embodiment can reduce an off current.

It is desirable that the source electrode ST and the drain electrode DT are respectively formed in a spaced-apart manner from the gate electrode GT with 1 μm or more as viewed in a plan view.

Above the upper surface of the first substrate SUB1, the protective film PAS which covers the drain signal line DL and the source electrode ST is formed. Further, a leveling film OC made of a resin material is formed on the protective film PAS sequentially, for example.

On an upper surface of the leveling film OC, a pixel electrode PX made of ITO (Indium Tin Oxide) is formed in the substantially whole area of the pixel region, and the pixel electrode PX is connected with the source electrode ST via a contact hole TH3 which is formed in the leveling film OC and the protective film PAS coaxially with the source electrode ST.

The pixel electrode PX is configured to generate an electric field between the pixel electrode PX and a counter electrode which is formed of a transparent conductive film made of ITO or the like, for example, and is formed on a liquid-crystal-side surface of another substrate (second substrate) not shown in the drawing arranged to face the first substrate SUB1 in an opposed manner with liquid crystal sandwiched therebetween. Due to such an electric field, liquid crystal is driven.

Further, in this embodiment, the display device has the bottom-gate structure. Accordingly, with respect to the low-concentration impurity layers LDD, the regions of the low-concentration impurity layers LDD which are formed between the drain electrode DT and the source electrode ST are shielded from the backlight light radiated from a side of the first substrate SUB1 opposite to the background layer GRL by the gate electrode GT and hence, even when a strong electric field is generated at an end of the drain electrode DT, it is possible to prevent the generation of an optical leak current in the thin film transistor TFT.

Here, the pixel to which the invention is applicable is not limited to the above-mentioned pixel. For example, the invention is also applicable to a so-called lateral-electric-field-type display device such as an IPS (In Plane Switching)-type display device where a plurality of linear pixel electrodes and a plurality of linear counter electrodes are arranged on a first substrate SUB1, or an IPS-Pro-type display device where a planar counter electrode is formed on a first substrate SUB1 and a plurality of linear pixel electrodes are arranged in an overlapping manner with the counter electrode by way of an insulation film.

FIG. 4 to FIG. 19 are step views showing one example of a manufacturing method of the display device according to the embodiment of the invention. That is, FIG. 4 to FIG. 19 show manufacturing steps of a portion shown in FIG. 2 or manufacturing steps in a cross section corresponding to FIG. 3. Hereinafter, the steps are explained sequentially.

Figure 4:
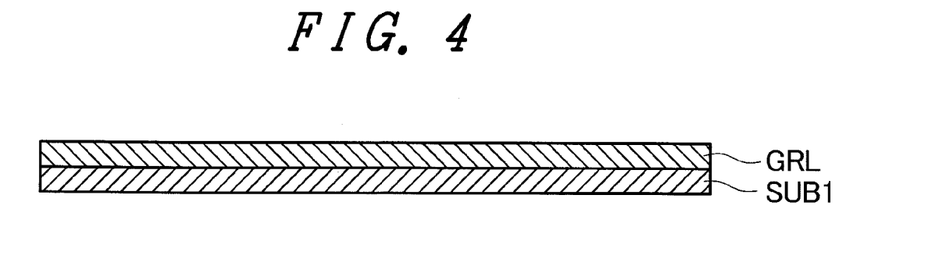
FIG. 4 is a step view showing one example of a manufacturing method of a display device according to an embodiment of the invention.

Step 1. (FIG. 4)

On the liquid-crystal-side surface of the first substrate SUB1 made of glass, for example, the background layer GRL formed of a silicon nitride film is formed by a known CVD (Chemical Vapor Deposition) method. The background layer GRL is provided for preventing impurities in the first substrate SUB1 from entering the semiconductor layer PS of the thin film transistor TFT.

Figure 5:
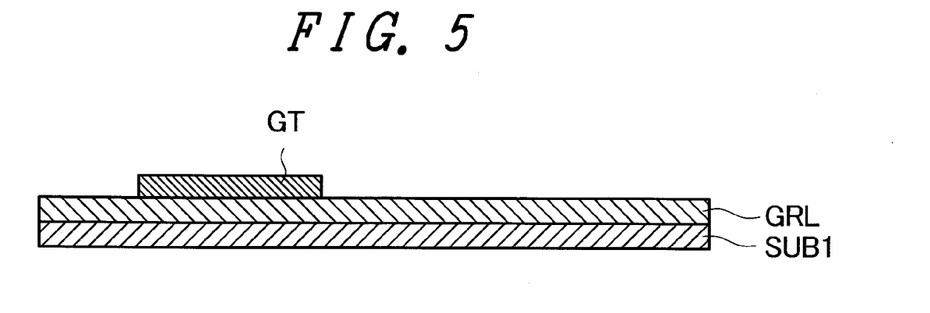
FIG. 5 is a step view showing one example of the manufacturing method of the display device according to the embodiment of the invention.

Step 2. (FIG. 5)

The gate electrode GT is formed on an upper surface of the background layer GRL. The gate electrode GT is, for example, made of high-melting-point metal such as Mo or W. This is because, as described later, in this embodiment, a semiconductor layer of the thin film transistor TFT is made of polysilicon which is obtained by melting and recrystallizing amorphous silicon so that the gate electrode GT is exposed to high temperature at the time of forming the semiconductor layer.

Figure 6:
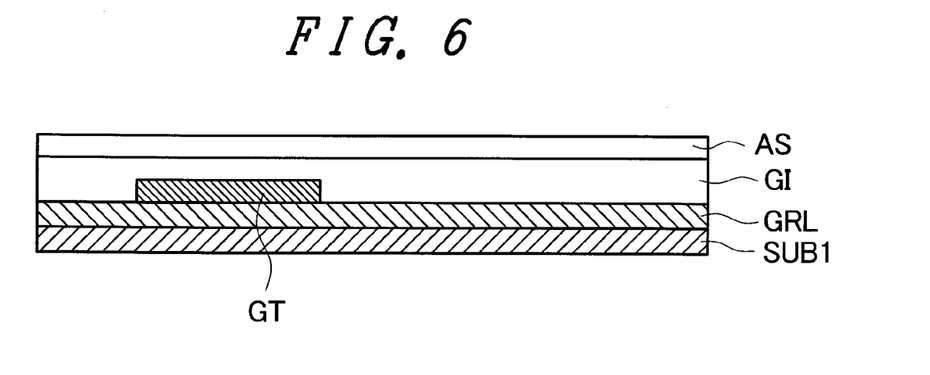
FIG. 6 is a step view showing one example of the manufacturing method of the display device according to the embodiment of the invention.

Step 3. (FIG. 6)

Over the upper surface of the first substrate SUB1, the insulation film GI which covers the gate electrode GT and is formed of a silicon oxide film or a silicon nitride film is formed by a CVD method, for example. Then, on an upper surface (upper layer) of the insulation film GI, an amorphous semiconductor layer AS made of amorphous silicon is formed. The insulation film GI may have the stacked structure constituted of a silicon oxide film and a silicon nitride film.

Figure 7:
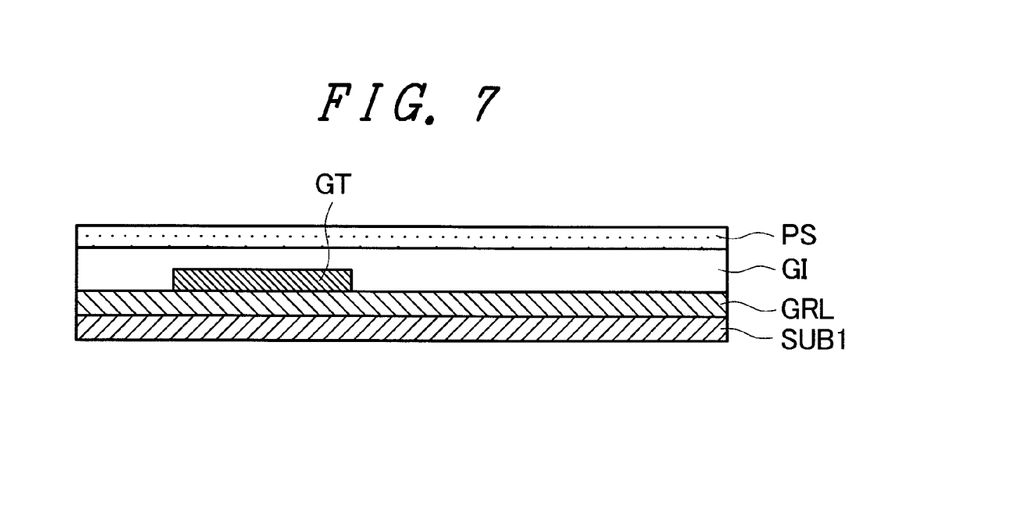
FIG. 7 is a step view showing one example of the manufacturing method of the display device according to the embodiment of the invention.

Step 4. (FIG. 7)

Firstly, dehydrogenation treatment is applied to the amorphous semiconductor layer AS and, after the dehydrogenation treatment, the amorphous semiconductor layer AS is transformed into a polycrystalline semiconductor layer PS made of polysilicon by radiating a laser beam using an excimer laser (excimer laser annealing), for example.

Figure 8:
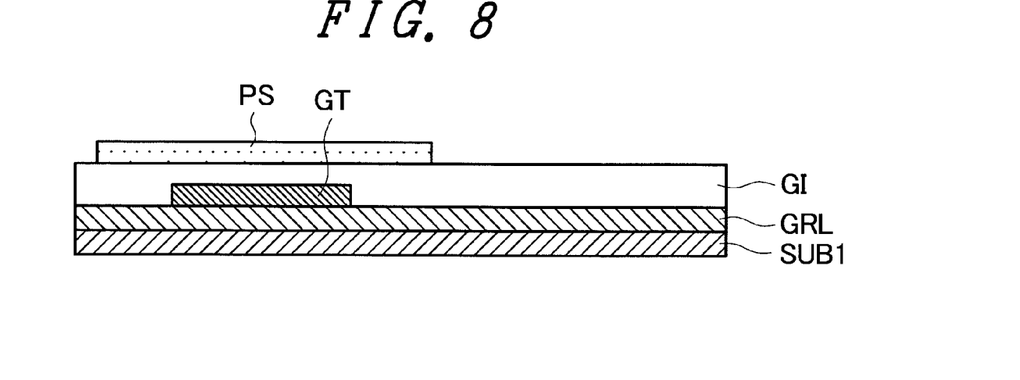
FIG. 8 is a step view showing one example of the manufacturing method of the display device according to the embodiment of the invention.

Step 5. (FIG. 8)

By etching the semiconductor layer PS using a well-known photolithography technique, the semiconductor layer PS is left in a region where the thin film transistor TFT is formed, and the semiconductor layer PS in other regions is removed.

Figure 9:
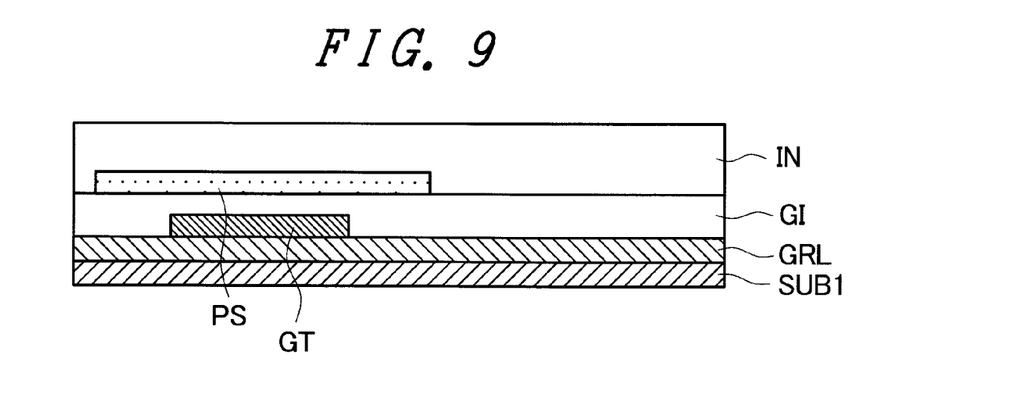
FIG. 9 is a step view showing one example of the manufacturing method of the display device according to the embodiment of the invention.

Step 6. (FIG. 9)

Over the upper surface (upper layer) of the first substrate SUB1, the interlayer insulation film IN which covers the semiconductor layer PS and the insulation film GI and is formed of a silicon oxide film, for example, is formed by a CVD method, for example. The interlayer insulation film IN plays a role of forming a capacity between the gate signal line GL and the drain signal line DL, and also plays a role of a through film at the time of implanting impurities as will become apparent later. Accordingly, it is desirable to set a film thickness of the interlayer insulation film IN to 200 nm or less, for example, by taking such roles into consideration.

Then, impurities made of boron ions, for example, are implanted to the semiconductor layer PS for controlling a threshold voltage (Vth) of the thin film transistor TFT.

Figure 10:
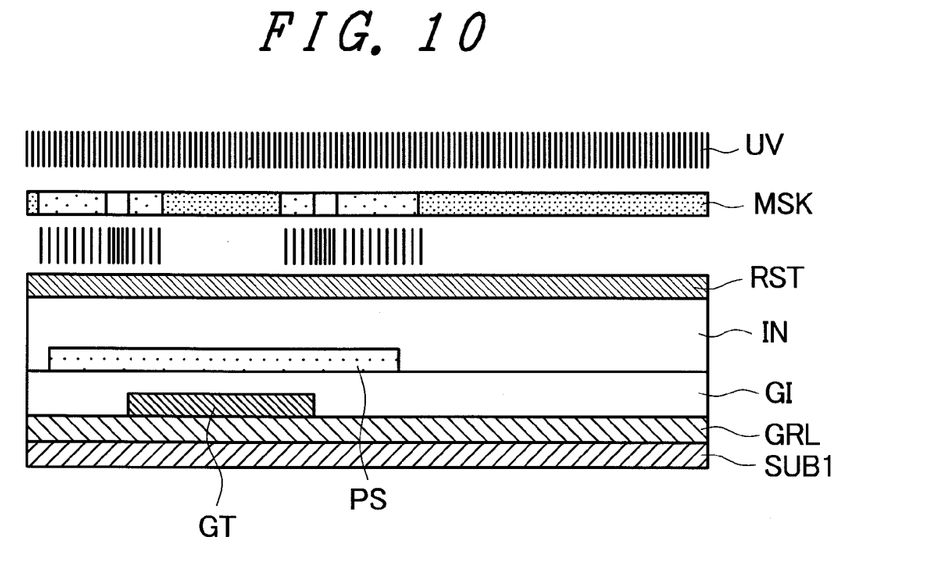
FIG. 10 is a step view showing one example of the manufacturing method of the display device according to the embodiment of the invention.

Step 7. (FIG. 10)

A photoresist film RST is applied to an upper surface (upper layer) of the interlayer insulation film IN by coating. Thereafter, using a well-known half-exposure method (half-tone exposure method) and a well-known half-etching technique, exposure (radiation of ultraviolet rays UV) for forming holes RST0 described later and regions RST1 which are formed around the holes RST0 are performed. Here, the photoresist film in the region RST1 has a film thickness smaller than a film thickness of the photoresist film in other region RST2.

In this embodiment, the photoresist film RST is made of a positive resist. Using an exposure mask MSK for half exposure, a total amount of ultraviolet rays UV (total radiation) is applied to portions of the photoresist film RST where the holes RST0 are formed, a half amount of ultraviolet rays UV (partial radiation) is applied to portions of the regions RST1 where the photoresist film RST having a small thickness is formed, and other regions are shielded from the radiation of ultraviolet rays UV.

Figure 11:
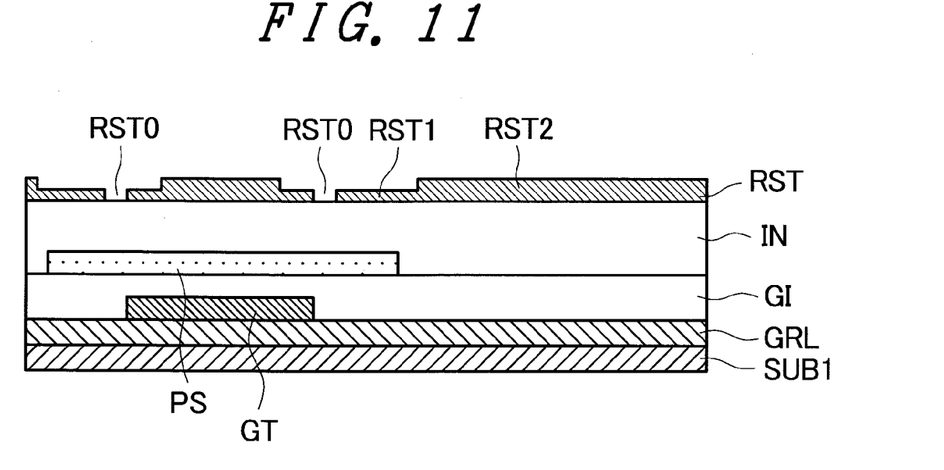
FIG. 11 is a step view showing one example of the manufacturing method of the display device according to the embodiment of the invention.

Step 8. (FIG. 11)

By developing the photoresist film RST, the holes RST0 are formed in the photoresist film RST. Here, as described previously, since the photoresist film RST is exposed using a half exposure technique, the regions RST1 where the film thickness of the photoresist film is smaller than the film thickness of the photoresist film in other regions RST2 are formed around the holes RST0. Here, the holes RST0 substantially correspond to a connection portion between the drain electrode DT and the semiconductor layer PS and a connection portion between the source electrode ST and the semiconductor layer PS in the thin film transistor TFT. The regions RST1 substantially correspond to regions where the LDD layers formed on the semiconductor layer PS in a step described later are formed. By forming the photoresist film RST which is constituted of the holes RST0, the regions RST1 and the other region RST2, it is possible to suppress the increase of the number of steps necessary for the formation of the contact layer CNL and the low-concentration impurity layer LDD described later.

Figure 12:
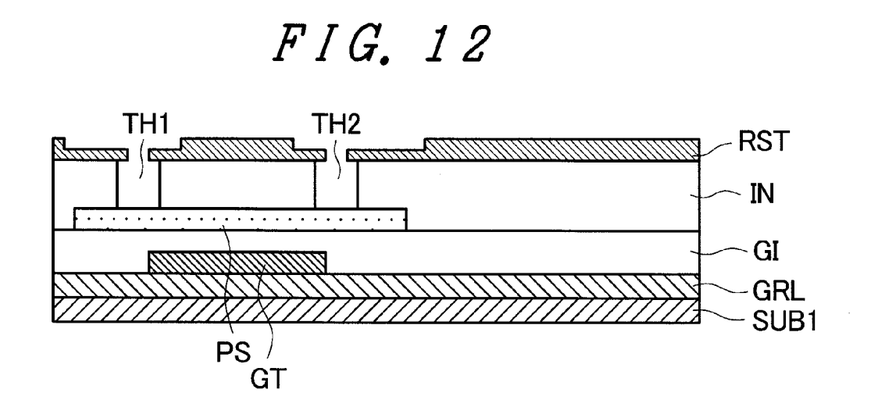
FIG. 12 is a step view showing one example of the manufacturing method of the display device according to the embodiment of the invention.

Step 9. (FIG. 12)

By etching the interlayer insulation film IN using the photoresist film RST as an etching mask, the contact holes TH1, TH2 are formed in the protective film PAS and the interlayer insulation film IN. The formation of the contact holes TH1, TH2 is performed until a surface of the semiconductor layer PS is exposed. Here, the contact holes TH1, TH2 are etched by side etching so that, in a cross-sectional view shown in FIG. 12, widths of the contact holes TH1, TH2 are set larger than a width of the hole RST0.

Figure 13:
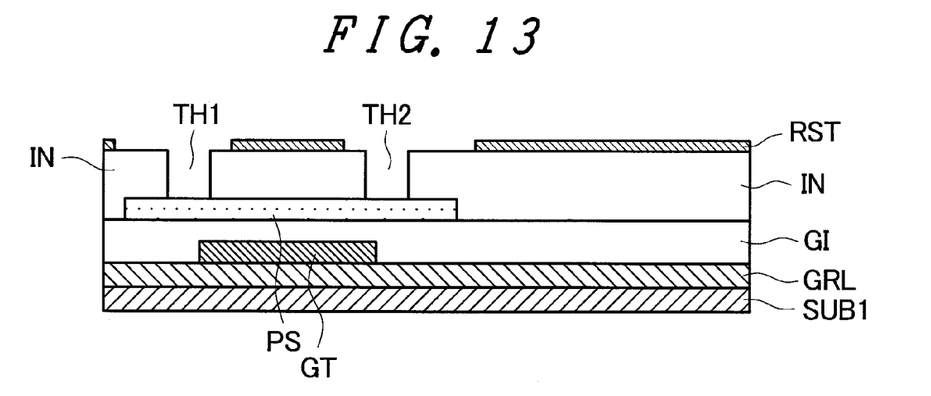
FIG. 13 is a step view showing one example of the manufacturing method of the display device according to the embodiment of the invention.

Step 10. (FIG. 13)

Ashing treatment (half ashing treatment) is applied to the photoresist film RST. By applying the ashing treatment to the photoresist film RST, portions of the photoresist film RST in the regions RST1 which are formed around the holes RST0 are removed.

Figure 14:
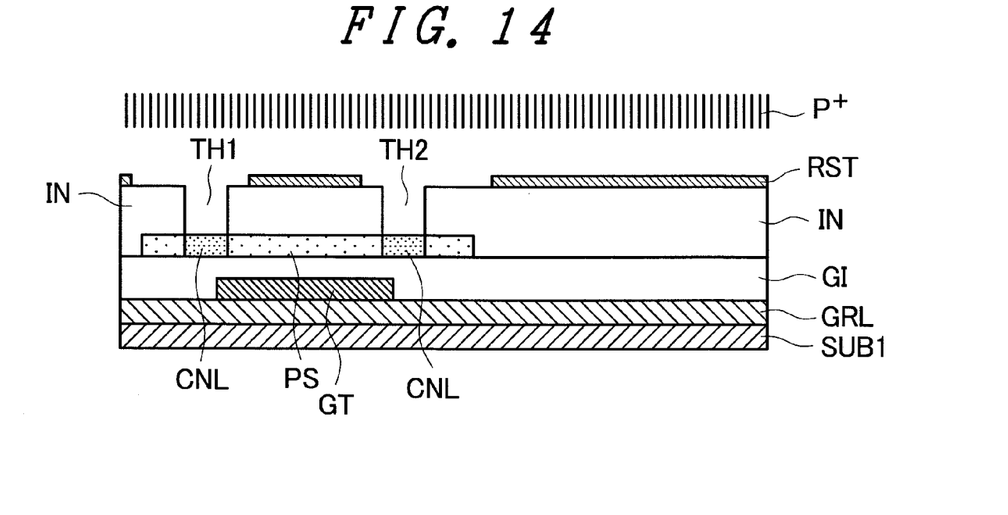
FIG. 14 is a step view showing one example of the manufacturing method of the display device according to the embodiment of the invention.

Step 11. (FIG. 14)

The implantation of high-concentration impurities made of phosphorous ions ($P^+$), for example, is performed by ion implantation using the photoresist film RST as a mask. Here, at portions of the semiconductor layer PS where the semiconductor layer PS is exposed due to the contact holes TH1, TH2, a peak position of implanted impurities is set to a middle portion of the semiconductor layer PS in the thickness direction (for example, a center position in the thickness direction of the semiconductor layer PS). Accordingly, in the regions where the interlayer insulation film IN is present, the peak position of implanted impurities is set to a middle portion of the interlayer insulation film IN in the thickness direction.

Due to such implantation of impurities, the contact layers CNL are formed in the semiconductor layer PS.

On the other hand, in the regions where the interlayer insulation film IN is present, most of impurities remains in the interlayer insulation film IN, and the semiconductor layer PS which correspond to the regions is hardly doped with impurities.

Figure 15:
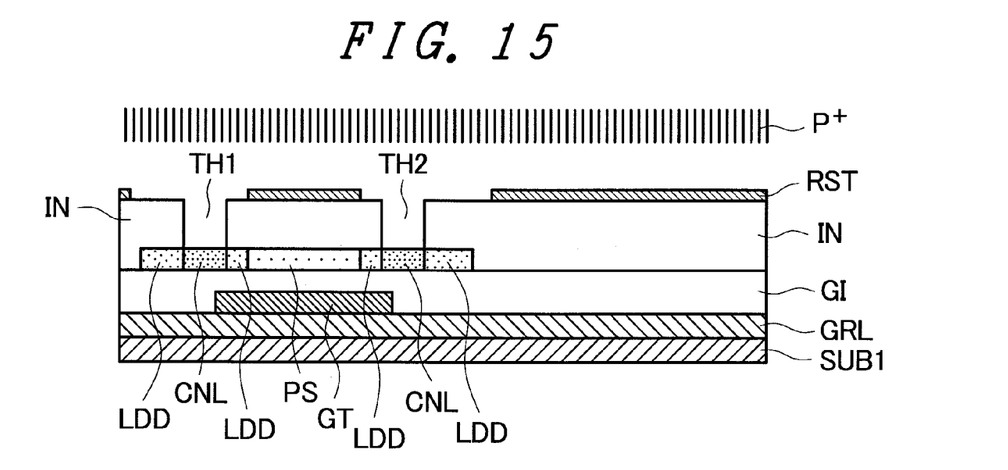
FIG. 15 is a step view showing one example of the manufacturing method of the display device according to the embodiment of the invention.

Step 12. (FIG. 15)

The implantation of low-concentration impurities made of phosphorous ions ($P^+$), for example, is performed by ion implantation using the photoresist film RST as a mask. Here, in the regions where the interlayer insulation film IN is present, the peak position of implanted impurities is set to a middle portion of the semiconductor layer PS in the thickness direction (for example, a center position of the semiconductor layer PS in the thickness direction). Accordingly, at portions where the semiconductor layer PS is exposed due to the contact holes TH1, TH2, the peak position of the implanted impurities is arranged below the semiconductor layer PS.

Due to such implantation of impurities, the low-concentration impurity layers LDD are formed in the semiconductor layer PS.

Here, in the region where the interlayer insulation film IN is present, most of impurities reach and remain in a layer below the semiconductor layer PS, and the semiconductor layer PS which corresponds to the region is hardly doped with impurities.

Then, the photoresist film RST is removed and, thereafter, annealing treatment is performed for activating impurities implanted into the semiconductor layer PS.

Figure 16:
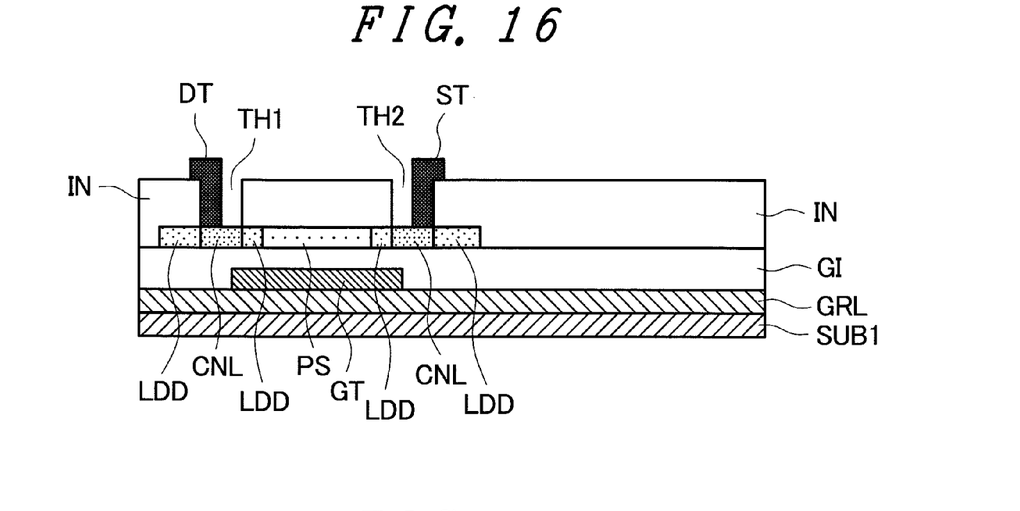
FIG. 16 is a step view showing one example of the manufacturing method of the display device according to the embodiment of the invention.

Step 13. (FIG. 16)

On the upper surface of the first substrate SUB1, a metal layer made of aluminum (Al) is formed, and the metal layer is etched using a photolithography technique thus forming the drain electrode DT which is connected with the contact layer CNL via one contact hole TH1 formed in the interlayer insulation film IN and the source electrode ST which is connected with the contact layer CNL via the other contact hole TH2 formed in the interlayer insulation film IN. Here, in forming the drain electrode DT and the source electrode ST by etching the metal layer made of aluminum (Al), the metal layer is etched such that a connecting portion between the drain electrode DT and the contact layer CNL and a connecting portion between the source electrode ST and the contact layer CNL are set smaller than an exposed region of the contact layer CNL in the contact holes TH1, TH2 respectively and, at the same time, the connecting portions do not overlap with the gate electrode GT as viewed in a plan view. In this embodiment, the drain electrode DT and the source electrode ST are respectively formed within the one half of a region along a side wall surface of the contact hole TH1, TH2 on a side opposite to the gate electrode GT such that the drain electrode DT and the source electrode ST do not overlap with the gate electrode GT as viewed in a plan view. Here, it is desirable that the drain electrode DT and the source electrode ST are formed respectively such that a distance between the drain electrode DT and the gate electrode GT as viewed in a plan view and a distance between the source electrode ST and the gate electrode GT are set to 1 μm or more. Positions where the drain electrode DT and the source electrode ST are formed are not limited to the above-mentioned positions provided that the drain electrode DT and the source electrode ST are formed so as to satisfy the above-mentioned spaced-apart distance.

Here, the drain signal lines DL are also formed simultaneously with these electrodes.

Figure 17:
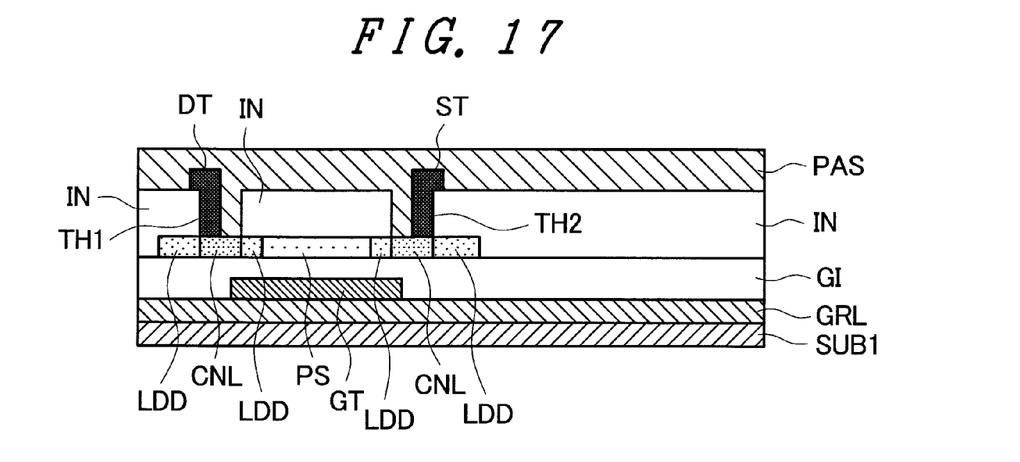
FIG. 17 is a step view showing one example of the manufacturing method of the display device according to the embodiment of the invention.

Step 14. (FIG. 17)

On the upper surface of the first substrate SUB1, the protective film PAS formed of a silicon nitride film, for example, is formed. Here, the regions where the contact layers CNL are exposed are formed in the contact holes TH1, TH2 and hence, the protective film PAS is formed also in these regions, and the protective film PAS and the contact layers CNL are brought into contact with each other. The protective film PAS is a film provided for protecting surfaces of the drain electrode DT, the drain signal line DL, the source electrode ST and the like.

Figure 18:
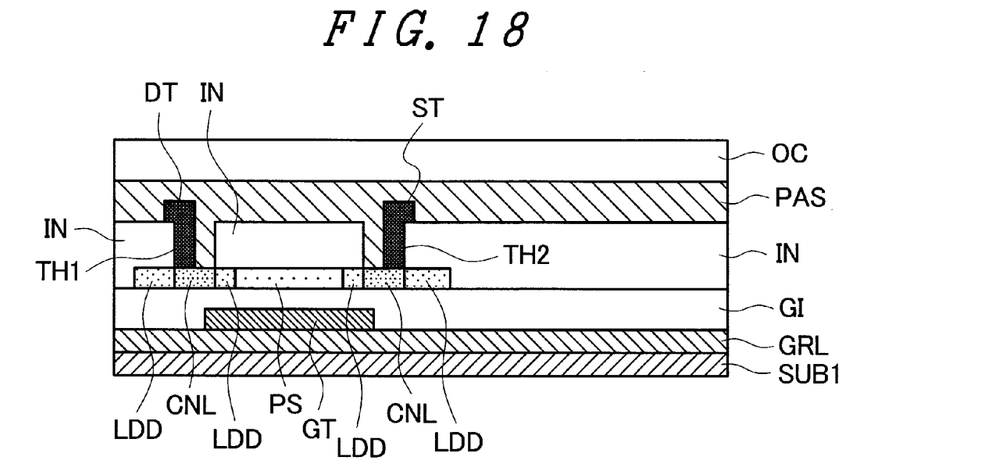
FIG. 18 is a step view showing one example of the manufacturing method of the display device according to the embodiment of the invention.

Step 15. (FIG. 18)

On the upper surface of the first substrate SUB1, the leveling film OC formed of a resin film, for example, is formed thus leveling a liquid-crystal-side surface of the first substrate SUB1.

Figure 19:
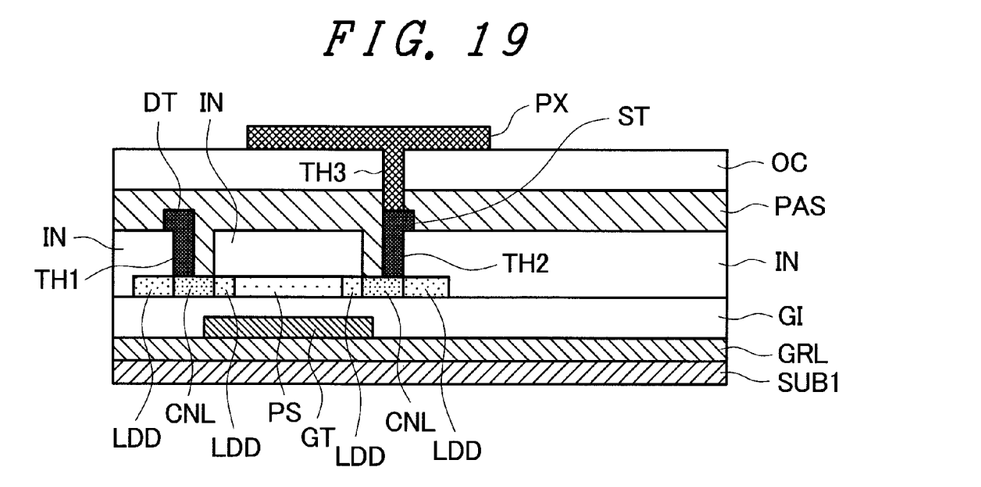
FIG. 19 is a step view showing one example of the manufacturing method of the display device according to the embodiment of the invention.

Step 16. (FIG. 19)

In the leveling film OC and the protective film PAS, the contact hole TH3 which exposes a portion of the source electrode ST is formed. Thereafter, on an upper surface (upper layer) of the leveling film OC, the pixel electrode PX formed of a transparent conductive film made of ITO, for example, is formed, and a portion of the pixel electrode PX is connected with the source electrode ST via the contact hole TH3.

Thereafter, an alignment film not shown in the drawing is formed, and alignment treatment is performed. Liquid crystal is sealed between the first substrate SUB1 and a counter substrate not shown in the drawing and these substrates are fixed to each other and, thereafter, a polarizer is formed thus forming a liquid crystal display panel. By mounting semiconductor elements for driving the drain signal lines DL, the gate signal lines GL, the common signal lines and the like, a backlight light source and the like on the liquid crystal display panel, a display device is formed.

As has been explained heretofore, the display device according to the invention is configured such that the pixels are formed within the display region in a matrix array, and each pixel is provided with the thin film transistor which includes the gate electrode, the gate insulation film which is formed so as to cover the gate electrode, the semiconductor layer which is formed on the gate insulation film so as to straddle the gate electrode, the interlayer insulation film which is formed so as to cover the semiconductor layer, and the drain electrode and the source electrode which are connected with the semiconductor layer via the contact holes formed in the interlayer insulation film and are arranged with the gate electrode of the semiconductor layer sandwiched therebetween.

Here, the source electrode ST and the drain electrode DT do not overlap with the gate electrode GT as viewed in a plan view and, at the same time, are not brought into contact with the low-concentration impurity layers LDD which are positioned at a channel region side. Accordingly, it is possible to suppress a phenomenon that a strong electric field is applied between the source electrode ST and the gate electrode GT and between the drain electrode DT and the gate electrode GT so that an electric field concentration alleviating effect of the low-concentration impurity layer LDD is lowered and a phenomenon that holes flow out from the connecting portions where the respective electrodes are brought into contact with the low-concentration impurity layers LDD. As a result, it is possible to reduce an OFF current of the thin film transistor.

Further, the region formed of the intrinsic semiconductor layer or the P− layer which is substantially equal to the region formed of the intrinsic semiconductor layer or the P− layer of the channel region is not formed outside the low-concentration impurity layers LDD. Accordingly, it is possible to reduce an optical leak current of the thin film transistor. Further, the region of the low-concentration impurity layers LDD which is formed between the drain electrode DT and the source electrode ST overlaps with the gate electrode GT as viewed in a plan view and hence, it is possible to reduce the optical leak current of the thin film transistor.

Further, in the manufacturing method of the display device according to the invention, the formation of the contact holes and the formation of the opening portions which correspond to the low-concentration impurity layer LDD forming positions are performed by adjusting the film thickness of the photoresist film by the half exposure and by patterning the photoresist film by half-ashing treatment. Further, the implantation of impurity ions is performed such that peak positions of implanted impurity ions are made different from each other. Due to such implantation of impurity ions, compared to a conventional manufacturing method in which photolithography is performed using different masks between the formation of the low-concentration impurity layers LDD and the formation of the high-concentration impurity layer, it is possible to obtain a remarkable advantageous effect that it is unnecessary to increase the number of manufacturing steps.

Although the invention made by inventors of the invention has been explained in detail in conjunction with the above-mentioned embodiment of the invention heretofore, the invention is not limited to the above-mentioned embodiment and various modifications are conceivable without departing from the gist of the invention.

What is claimed is:

1. A display device which includes thin film transistors on a substrate, each thin film transistor comprising:
a gate electrode;
a gate insulation film which is formed so as to cover the gate electrode;

a semiconductor layer which is formed on the gate insulation film in a state where the semiconductor layer straddles the gate electrode;

a pair of electrodes which is connected with the semiconductor layer; and an interlayer insulation film which is formed over the semiconductor layer, wherein a plurality of contact holes for connecting the semiconductor layer and the pair of electrodes are formed in the interlayer insulation film, the plurality of contact holes respectively have a region where the contact hole overlaps with the gate electrode as viewed in a plan view and a region where the contact hole does not overlap with the gate electrode as viewed in a plan view, the semiconductor layer includes a first layer, a pair of second layers and a pair of third layers, a portion of the first layer is a channel region of the thin film transistor, the pair of second layers is formed of an impurity layer doped with predetermined impurity ions, the pair of third layers is formed of a low-concentration impurity layer with impurity concentration lower than impurity concentration in the second layers, the second layers respectively have connection portions which are connected with the pair of electrodes respectively via the contact holes, the third layers are respectively formed so as to annularly surround the pair of second layers respectively, a channel-region-side edge portion out of edge portions of the third layer is brought into contact with the first layer as viewed in a plan view, the edge portions of the third layer except for the channel-region-side edge portion are brought into contact with the interlayer insulation film, the second layers respectively have a first region where the second layer overlaps with the gate electrode as viewed in a plan view and a second region where the second layer does not overlap with the gate electrode as viewed in a plan view, and the connection portion is formed in the second region.

2. The display device according to claim 1, wherein the pair of respective electrodes is formed in a spaced-apart manner from the gate electrode with 1 μm or more as viewed in a plan view.

3. A display device which includes thin film transistors on a substrate each thin film transistor comprising:

a gate electrode;

a gate insulation film which is formed so as to cover the gate electrode;

a semiconductor layer which is formed on the gate insulation film in a state where the semiconductor layer straddles the gate electrode;

a pair of electrodes which is connected with the semiconductor layer; and an interlayer insulation film which is formed over the semiconductor layer, wherein the semiconductor layer includes a first layer, of second layers and a pair of third layers, a portion of the first layer is a channel region of the thin film transistor, the pair of second layers is formed of an impurity layer doped with predetermined impurity ions, the pair of third layers is formed of a low-concentration impurity layer with impurity concentration lower than impurity concentration in the second layers, the second layers respectively have connection portions which are connected with the pair of electrodes respectively, the third layers are respectively formed so as to annularly surround the pair of second layers respectively, a channel-region-side edge portion out of edge portions of the third layer is brought into contact with the first layer as viewed in a plan view, the edge portions of the third layer except for the channel-region-side edge portion are brought into contact with the interlayer insulation film, the second layers respectively have a first region where the second layer overlaps with the gate electrode as viewed in a plan view and a second region where the second layer does not overlap with the gate electrode as viewed in a plan view, and the connection portion is formed in the second region, wherein contact holes are formed in the interlayer insulation film, the pair of electrodes is connected with the second layers via the contact holes, and one of the contact holes is filled with one of the pair of electrodes and an insulation film different from the interlayer insulation film.

4. The display device according to claim 1, wherein out of the pair of electrodes, at least one electrode includes an aluminum thin film.

5. The display device according to claim 1, wherein the semiconductor layer is made of polysilicon or microcrystalline silicon.

6. The display device according to claim 1, wherein
one of the contact holes is filled with one of the pair of electrodes and an insulation film different from the interlayer insulation film.

* * * * *